(12) United States Patent
Stine et al.

(10) Patent No.: US 6,475,871 B1
(45) Date of Patent: Nov. 5, 2002

(54) PASSIVE MULTIPLEXOR TEST STRUCTURE FOR INTEGRATED CIRCUIT MANUFACTURING

(75) Inventors: Brian E. Stine, Santa Clara, CA (US); Christopher Hess, San Ramon, CA (US); Larg H. Weiland, San Ramon, CA (US)

(73) Assignee: PDF Solutions, Inc., San Jose, CA (US)

( * ) Notice: Subject to any disclaimer, the term of this patent is extended or adjusted under 35 U.S.C. 154(b) by 6 days.

(21) Appl. No.: 09/715,851

(22) Filed: Nov. 17, 2000

Related U.S. Application Data
(60) Provisional application No. 60/166,375, filed on Nov. 18, 1999.

(51) Int. Cl.$^7$ ................................................. H02L 21/20
(52) U.S. Cl. ........................................ 438/381; 324/754
(58) Field of Search ................. 257/48; 356/230.06; 438/18; 365/201

(56) References Cited

U.S. PATENT DOCUMENTS

| | | | |
|---|---|---|---|
| 3,751,647 A | 8/1973 | Maeder et al. ......... 235/151.11 |
| 4,795,964 A | 1/1989 | Mahant-Shetti et al. ...... 324/60 |
| 4,835,466 A | 5/1989 | Maly et al. ............. 324/158 R |
| 4,939,681 A | 7/1990 | Yokomizo et al. .......... 364/578 |
| 5,067,101 A | 11/1991 | Kunikiyo et al. ........... 364/578 |
| 5,068,547 A | 11/1991 | Gascoyne .................. 307/443 |
| 5,070,469 A | 12/1991 | Kunikyo et al. ............ 364/578 |
| 5,286,656 A | 2/1994 | Keown et al. .............. 324/158 |
| 5,301,118 A | 4/1994 | Heck et al. ................. 364/468 |
| 5,438,527 A | 8/1995 | Feldbaumer et al. ........ 364/578 |
| 5,486,786 A | 1/1996 | Lee ............................. 327/378 |
| 5,502,643 A | 3/1996 | Fujinaga ..................... 354/488 |
| 5,625,268 A | 4/1997 | Miyanari .................... 318/696 |
| 5,627,083 A | 5/1997 | Tounai ......................... 438/18 |
| 5,629,877 A | 5/1997 | Tamegaya ................... 364/578 |
| 5,655,110 A | 8/1997 | Krivokapic et al. ........ 395/500 |
| 5,703,381 A | 12/1997 | Iwasa et al. .................. 257/48 |
| 5,778,202 A | 7/1998 | Kuroishi et al. ............ 395/306 |

(List continued on next page.)

OTHER PUBLICATIONS

D Kahng, T.A. Shankoff, T.T. Sheng and S.E. Haszko; "A Method for Area Saving Palnar Isolation Oxides Using Oxidation Protected Sidewalls", Nov. 1980, J Electrochem. Soc.: Solid State Sceince and Technology; p. 2468–2471.*

Walton et al., "A Novel Approach for Reducing the Area Occupied by Contact Pads on Process Control Chips", *Proc. IEEE 1990 Int. Conference on Microelectronic Test Structures*, vol. 9, Mar. 1990, pp. 75–80.

Beckers and Hilltrop, "The Spidermask: A New Approach for Yield Monitoring Using Product Adaptable Tet Structures", *Proc IEEE 1990 Int. Conference on Microelectronic Test Structures*, vol. 8, Mar. 1990, pp. 61–66.

Liebman et al. "Understanding Across Chip Lane Width Variation: The First Step Toward Optical Proximity Correction", SPIE vol. 3051, pp. 124–136.

PCT International Search Report, Feb. 20, 2001.

(List continued on next page.)

*Primary Examiner*—John F. Niebling
*Assistant Examiner*—Andre C Stevenson
(74) *Attorney, Agent, or Firm*—Duane Morris LLP

(57) ABSTRACT

A test structure for analyzing failures due to fabrication induced defects in integrated circuits includes a matrix of bit cells formed by word lines and bit lines. An associated word line probe pad is electrically connected to each word line and an associated bit line probe pad electrically connected to each bit line. A test structure is electrically connected between a word line and a bit line of an associated bit cell. Each test structure has at least one variable attribute which is used to detect defects and create yield models.

23 Claims, 9 Drawing Sheets

U.S. PATENT DOCUMENTS

| | | | | |
|---|---|---|---|---|
| 5,790,479 | A | 8/1998 | Conn | 368/118 |
| 5,798,649 | A | 8/1998 | Smayling et al. | 324/551 |
| 5,822,258 | A | 10/1998 | Casper | 365/201 |
| 5,852,581 | A | 12/1998 | Beffa et al. | 365/201 |
| 5,867,033 | A | 2/1999 | Sporck et al. | 324/763 |
| 5,903,012 | A | 5/1999 | Boerstler | 257/48 |
| 5,966,527 | A | 10/1999 | Krivokapic et al. | 395/500.35 |
| 5,982,929 | A | 11/1999 | Ilan et al. | 382/200 |
| 5,999,480 | A * | 12/1999 | Ong | 365/230.06 |
| 6,005,829 | A | 12/1999 | Conn | 368/118 |
| 6,063,132 | A | 5/2000 | DeCamp et al. | 716/5 |
| 6,066,179 | A | 5/2000 | Allan | 716/4 |
| 6,072,804 | A | 6/2000 | Beyers, Jr. | 370/450 |
| 6,075,417 | A | 6/2000 | Cheek et al. | 331/44 |
| 6,075,418 | A | 6/2000 | Kingsley et al. | 331/57 |
| 6,118,137 | A | 9/2000 | Fulford, Jr. et al. | 257/48 |
| 6,124,143 | A | 9/2000 | Sugasawara | 438/18 |
| 6,134,191 | A | 10/2000 | Alfke | 368/118 |

OTHER PUBLICATIONS

Nurani et al., "In–Line Yield Prediction Methodologies Using Patterned Wafer Inspection Information", IEEE Transactions on Semiconductor Manufacturing, vol. 11, No. 1, Feb. 1998, pp. 40–47.

International Search Report dated Jun. 8, 2001.

Khare et al., "Yield–Oriented Computer–Aided Defect Diagnosis", IEEE Trans. on Semiconductor Manufacturing, vol. 8, No. 2, May 1995, pp. 195–206.

To and Ismail, "Mismatch Modeling and Characterization of Bipolar Transistors for Statistical CAD", IEEE Trans on Circuits and Systems–I: Fundamental Theory and Applications, vol. 43, No. 7, Jul. 1996, pp. 608–610.

Conti et al., "Parametric Yield Formulation of MOS IC's Affected by Mismatch Effect", IEEE Trans. on Computer–Aided Design of Integrated Circuits and Systems, vol. 18, No. 5, May 1999, pp. 582–596.

Michael et al., "A Flexible Statistical Model for CAD of Submicrometer Analog CMOS Integrated Circuits", Computer Aided Design 1993 IEEE/ACM International Conference on Computer–Aided Design, Nov. 1993, pp. 330–333.

Felt et al., "Measurement and Modeling of MOS Transistor Current Mismatch in Analog ICC's", 1994 IEEE/ACM International Conference on Computer–Aided Design, Nov. 1994, pp. 272–277.

Ogrenci et al., "Incorporating MOS Transistor Mismatches into Training of Analog Neural Networks", Proceedings of NC. International ICSC/IFAC Symposium on Neural Computation, Sep. 1998, Abstract.

* cited by examiner

▒ Few Failures
▓ Many Failures

Test Scheme:
X means OPEN
0 means apply 0 Volts
1 means apply V volts

Measurement Pin = 0 it is a short
Measurement Pin = 1 it is a open

| Pin Number | | | | | | | | | | | | | | | | | | |
|---|---|---|---|---|---|---|---|---|---|---|---|---|---|---|---|---|---|---|
| | | | 1<br>9<br>17<br>25 | 2<br>10<br>18<br>26 | 3<br>11<br>19<br>27 | 4<br>12<br>20<br>28 | 5<br>13<br>21<br>29 | 6<br>14<br>22<br>30 | 7<br>15<br>23<br>31 | 8<br>16<br>24<br>32 | | | | | | | | |
| Test Vector | Row | Column | | | | | | | | | Measurement | Measurement Pins |
| 1 | 1 | 1 | 0 | 1 | 1 | 1 | 1 | X | X | X | Open test | 5,13,21,29 |
| 2 | 2 | 2 | 0 | 1 | 1 | 1 | X | 1 | X | X | Open test | 6,14,22,30 |
| 3 | 3 | 3 | 0 | 1 | 1 | 1 | X | X | 1 | X | Open test | 7,15,23,31 |
| 4 | 4 | 4 | 0 | 1 | 1 | 1 | X | X | X | 1 | Open test | 8,16,24,32 |
| 5 | 1 | 5 | 1 | 0 | 1 | 1 | 1 | X | X | X | Open test | 5,13,21,29 |
| 6 | 2 | 6 | 1 | 0 | 1 | 1 | X | 1 | X | X | Open test | 6,14,22,30 |
| 7 | 3 | 7 | 1 | 0 | 1 | 1 | X | X | 1 | X | Open test | 7,15,23,31 |
| 8 | 4 | 8 | 1 | 0 | 1 | 1 | X | X | X | 1 | Open test | 8,16,24,32 |
| 9 | 1 | 1 | 1 | 1 | 0 | 1 | 1 | X | X | X | Open test | 5,13,21,29 |
| 10 | 2 | 2 | 1 | 1 | 0 | 1 | X | 1 | X | X | Open test | 6,14,22,30 |
| 11 | 3 | 3 | 1 | 1 | 0 | 1 | X | X | 1 | X | Open test | 7,15,23,31 |
| 12 | 4 | 4 | 1 | 1 | 0 | 1 | X | X | X | 1 | Open test | 8,16,24,32 |
| 13 | 1 | 5 | 1 | 1 | 1 | 0 | 1 | X | X | X | Open test | 5,13,21,29 |
| 14 | 2 | 6 | 1 | 1 | 1 | 0 | X | 1 | X | X | Open test | 6,14,22,30 |
| 15 | 3 | 7 | 1 | 1 | 1 | 0 | X | X | 1 | X | Open test | 7,15,23,31 |
| 16 | 4 | 8 | 1 | 1 | 1 | 0 | X | X | X | 1 | Open test | 8,16,24,32 |

FIG. 9A

PASSIVE MULTIPLEXOR TEST STRUCTURE FOR INTEGRATED CIRCUIT MANUFACTURING

CROSS REFERENCE TO RELATED APPLICATION

This application claims priority from United States Provisional Patent Application Ser. No. 60/166,375, filed Nov. 18, 1999, the contents of which are incorporated by reference as if fully set forth herein.

BACKGROUND OF THE INVENTION

The present invention pertains to integrated circuits and more particularly to the design and measurement of test structures for via/contact yield improvement in semiconductor manufacturing.

The fabrication of integrated circuits is an extremely complex process that may involve hundreds of individual operations. Basically, the process includes the diffusion of precisely predetermined amounts of dopant material into precisely predetermined areas of a silicon wafer to produce active devices such as transistors. This is typically done by forming a layer of silicon dioxide on the wafer, then utilizing a photomask and photoresist to define a pattern of areas into which diffusion is to occur through the silicon dioxide mask. Openings are then etched through the silicon dioxide layer to define the pattern of precisely sized and located openings through which diffusion will take place. After a predetermined number of such diffusion operations have been carried out to produce the desired number of transistors in the wafer, they are interconnected as required by interconnection lines. These interconnects are typically formed by deposition of an electrically conductive material which is defined into the desired interconnect pattern by a photomask, photoresist and etching process. A typical completed integrated circuit may have millions of transistors contained with a 0.1 inch by 0.1 inch silicon chip and interconnects of submicron dimensions.

The conductors which connect from one interconnect layer to another interconnect layer (either above or below the current layer) are called vias. The conductors which connect from one interconnect layer to a transistor are called contacts. Typically, a large complete integrated circuit may have anywhere from 1–10 million vias and contacts. A failure of any one of these vias or contacts usually means a complete failure of the circuit. Thus, exceptionally high yields are required for vias and contacts (usually better than 5 failures per billion vias or contacts).

Traditionally, via and contact yields are measured by fabricating test structures composed of chains of vias or contacts connected end to end in a serial fashion such as shown in FIG. 1. As shown in FIG. 1, the test structure chain, generally designated 10, comprises the series connection of interconnects 12 of one interconnect layer with interconnects 14 of another interconnect layer through vias 16. The ends 18 of the chain 10 are routed to test pads (not shown) to which test equipment for determining failures is connected. Optical inspection equipment is usually not reliable or useful especially for current process technologies. These chains need to be long enough to permit measurement of very small failure rates. Unfortunately, overly long via or contact chain cannot be measured because the resistance would be too high. Also, if there is a failure in a 1,000,000 long via chain, there is no easy way of knowing exactly which via or contact failed. Sometimes, a via chain will be tapped at multiple places to overcome some of these limitations, but this is usually only a limited solution.

SUMMARY OF THE INVENTION

The present invention comprises a test structure for localizing via and contact failures and for determining spatial failures within a die. The test structure of the present invention enables determination and modeling of the effect of neighborhood and via attributes on yield; observation and modeling of spatial or systematic failures within a die; measurement and modeling of via or metal shorts independently from via opens; and enables the use of digital testers as well as analog testers.

DETAILED DESCRIPTION OF THE INVENTION

Figure 2:
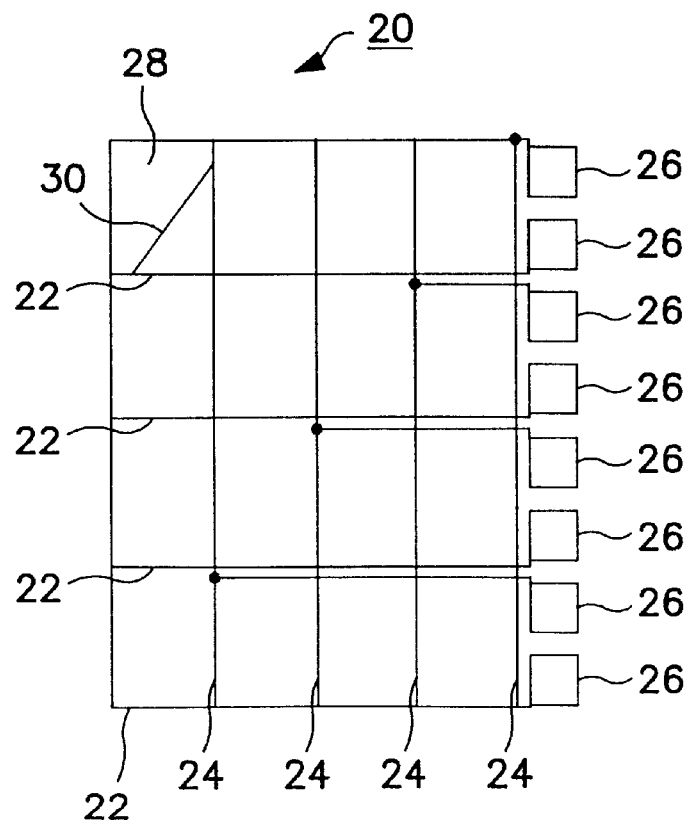
FIG. 2 depicts a configuration of an exemplary embodiment of a test structure in accordance with the present invention.

FIG. 2 a configuration of the test structure of the present invention, hereinafter referred to as a passive multiplexor test structure 20. The test structure 20 is composed of word lines 22 and bit lines 24, which connect to probe pads 26. Each region inside of a word line 22 and bit line 24 is called a bit cell 28. The word lines 22 and bit lines 24 are purposely made wide to prevent the introduction of any opens in the word 22 or bit 24 lines and to permit a low resistance path to each bit cell 28. Also, any vias used to connect the word lines 22 or bit lines 24 to the pads 26 are doubled up to insure that any opens are due from the bit cells themselves and not any parasitic opens in the vias or contacts used in the bit lines 24 or word lines 22. A bit cell test structure, schematically represented by line 30 in FIG. 2, is associated with a bit cell 28 and is electrically connected between a word line 22 and a bit line 24 of the associated bit cell 28.

Figure 1:
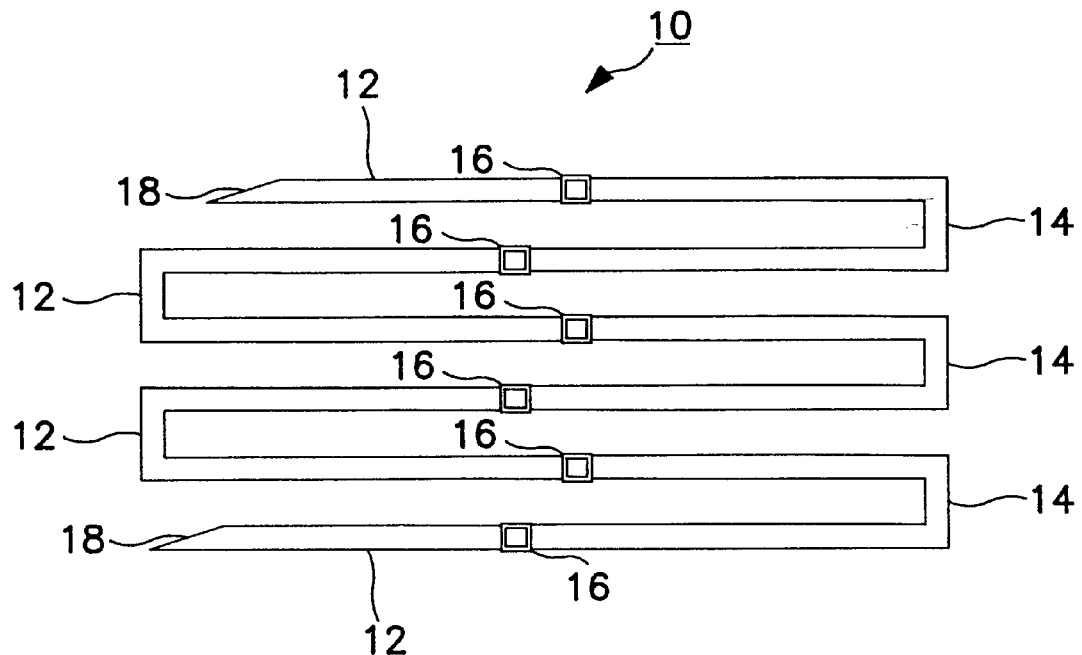
FIG. 1 is a schematic depiction of a traditional test structure chain comprising a series connection of interconnects of one interconnect layer with interconnects of another interconnect layer through vias.

The bit cell test structure 30 may be a traditional serial via or contact chain, for example of the type depicted in FIG. 1. The bit cell test structure 30 may also be another type of structure such as poly/contact/M1 or active/contact/M1. The use of such diverse structures is considered to be within the scope of the present invention. Each bit cell 28 of the multiplexor test structure 20 may have the same type of associated bit cell test structure 30, or different types of bit cell test structures 30 may be associated with different bit cells 28 within the same multiplexor test structure 20. In addition, not all bit cells 28 within a multiplexor test structure 20 need have an associated bit cell test structure. Such diversity and versatility is considered to be within the scope of the present invention.

Figure 3A:
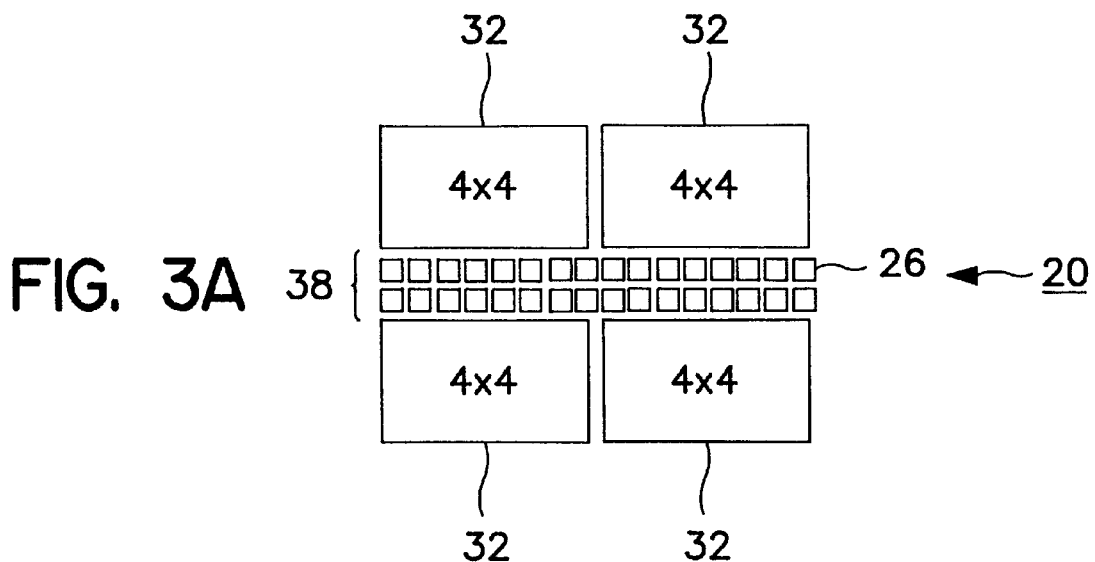
FIGS. 3A, 3B and 3C are schematic depictions of examples of different block configurations for a passive multiplexor test structure in accordance with the present invention.
Figure 3B:
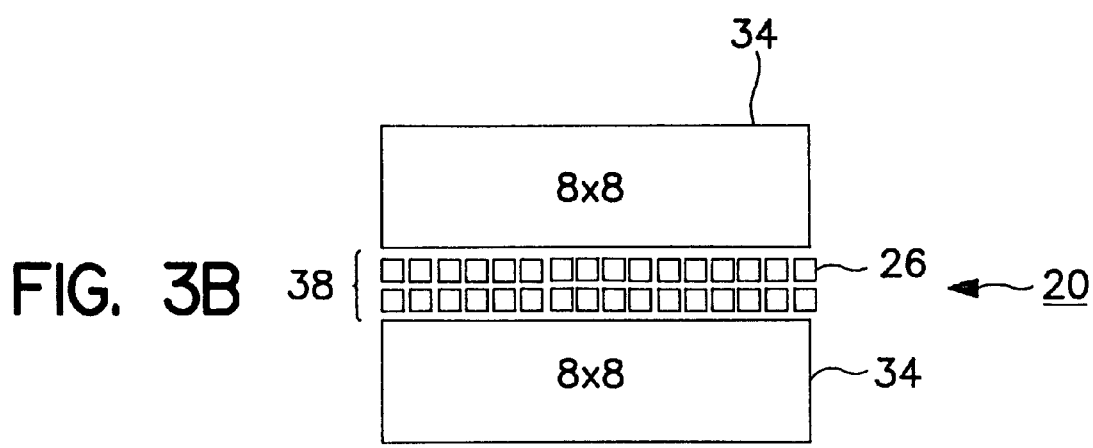
Figure 3C:
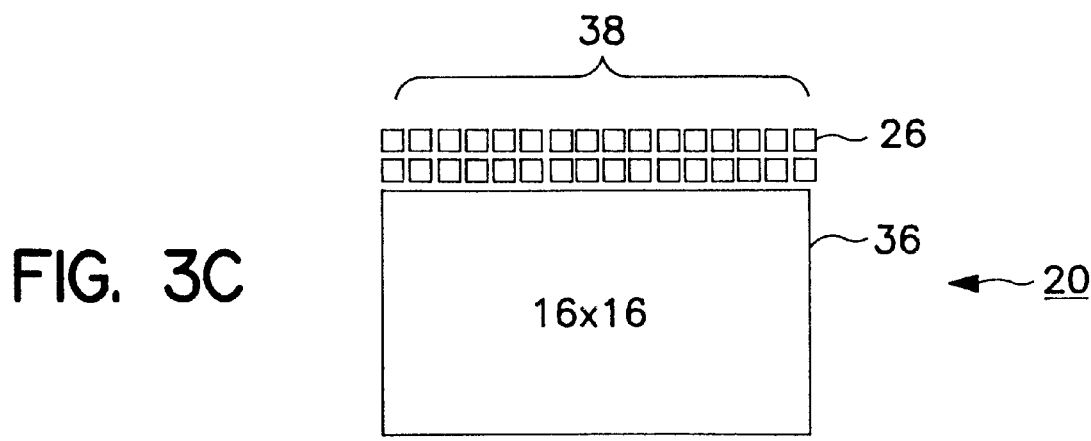

FIG. 3A shows a passive multiplexor test structure 20 in a 4×4 configuration; that is, it comprises four blocks 32, each of which comprises 4×4 or 16 individual bit cells 28. Other variants of the passive multiplexor test structure 20 are possible such as the 8×8 configuration depicted in FIG. 3B which has two blocks 34 each of which comprises 8×8 or 64 individual bit cells 28; and the 16×16 configuration depicted in FIG. 3C which has one block 36 which comprises 16×16 or 256 individual bit cells 28. The size of each block in a passive multiplexor test structure configuration is at the discretion of the designer, but each block can be no more than (N/2)×(N/2) in size where N is the number of probe pads 26 in each pad frame 38. In the examples depicted in FIGS. 3A–3B, there are 32 probe pads 26 in each pad frame 38. Thus, a block can contain as many as 256 individual bit cells 28 as depicted in FIG. 3C. The breakdown of a passive multiplexor into a 4×4, 8×8, or other configurations is a unique feature of the present invention which enables testing using digital testers; independent measurement of via/metal shorts from via opens; and modeling the effect of via attributes on via open and metal/via shorts.

Figure 4:
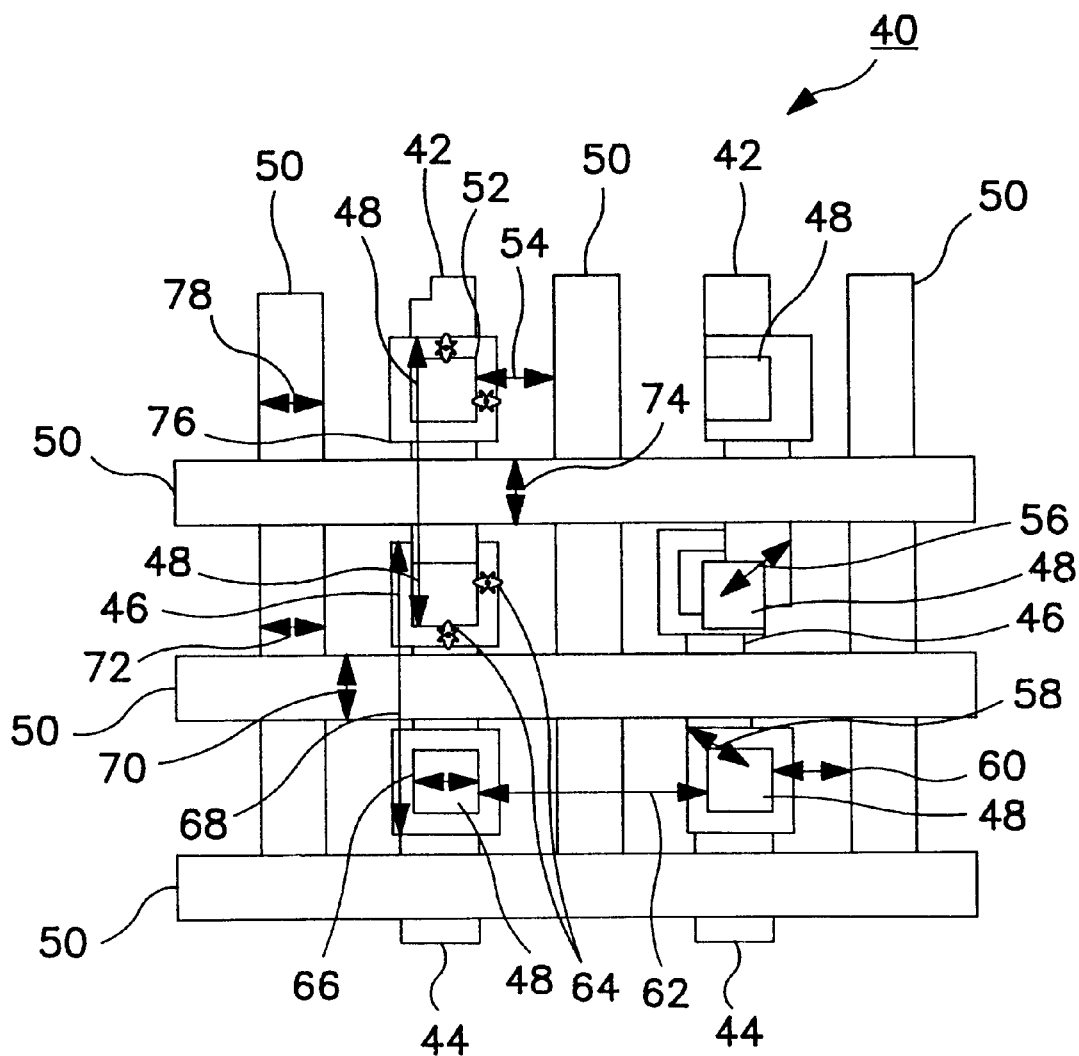
FIG. 4 is a schematic depiction of exemplary attributes used inside a bit cell to model via yield as a function of neighboring patterns and attributes of the via chain itself in accordance with the present invention.

The bit cell test structure inside each bit cell 28 of the passive multiplexor test structure is also a feature of the present invention. FIG. 4 depicts an example of a bit cell test structure, generally referred to as 40 in FIG. 4, that may be included inside each bit cell 28. The test structure 40 includes at least one via chain 42 which comprises at least one interconnect 44 formed in a first metal layer M1 connected to at least one interconnect 46 formed in a second metal layer M2 through at least one via 48. Each via chain 42 has several neighboring lines 50. FIG. 4 also depicts exemplary attributes of the test structure 40 that are used to model the via yield as a function of neighboring patterns and attributes of the via chain itself. These attributes include: M1 border x and y directions 52; spacing of M2 neighbor to via chain 54; misalignment of via to M1 x and y directions 56; misalignment of via to M2 x and y directions 58; spacing of M1 neighbor to via chain 60; spacing of via to nearest via 62; M2 border x and y directions 64; via hole size (a×b) 66; M2 runner length 68; M1 neighbor line width (perpendicular to via chain) 70; M2 neighbor line width (parallel to via chain) 72; M2 neighbor line width (perpendicular to via chain) 74; M1 runner length 76; and; M1 neighbor line width (parallel to via chain) 78. For purposes of this description, these are all termed "attributes".

The dimensions of the neighboring lines 50 and the distance from the via chain 42 to the neighboring lines 50 are varied in accordance with a feature of the present invention. In addition, the attributes of the via chain 42 itself such as the size of the via 48, the overlap of the via 48 to M1 interconnect 44 or M2 interconnect 46, the length of the M1 or M2 interconnect link in each via chain 46, and the misalignment of the via chain 46 to M1 or M2 interconnect patterns are variable as well. The neighboring lines 50 are connected to a separate probe pad (not shown) so that any shorting between the via chains 46 and the neighboring metal lines 50 can be detected. In addition, if vias are placed on the neighboring lines (not shown in FIG. 4), via to via shorting can be detected The above description of the [metal 1 (M1)]/via/[metal 2 (M2)] layers as the bit cell structure is exemplary of the type of structure which can be included within a bit cell of the multiplexor test structure in accordance with the present invention. Other types of layers include poly/contact/M1 and active/contact/M1 and such are considered to be within the scope of the present invention.

By creating a test chip where many of the above attributes are explored independently in a controlled fashion, yield models can be developed. For example, several 4×4 multiplexors can be created where each multiplexor has different via sizes and all other attributes kept the same. Then, by plotting the yield versus via size a yield model can be created. Also, by looking at the via yield versus the distance to neighboring metal, the line width of neighboring metal, and the borders around the via chain, the impact of neighborhood on via yield can be explored and modeled. If two structures are placed where one contains neighboring metal while the other structures contains the exact same neighboring metal and attributes plus dummy vias placed on the neighboring lines, the impact of shorting to neighboring vias or metals can be independently modeled. This can be accomplished by dividing the shorting yield of the structures with dummy vias by the yield of the structures without dummy vias. In this way, the components of shorting yield due to shorts to neighboring lines versus shorts to neighboring vias can be separated and independently modeled.

Figure 5A:
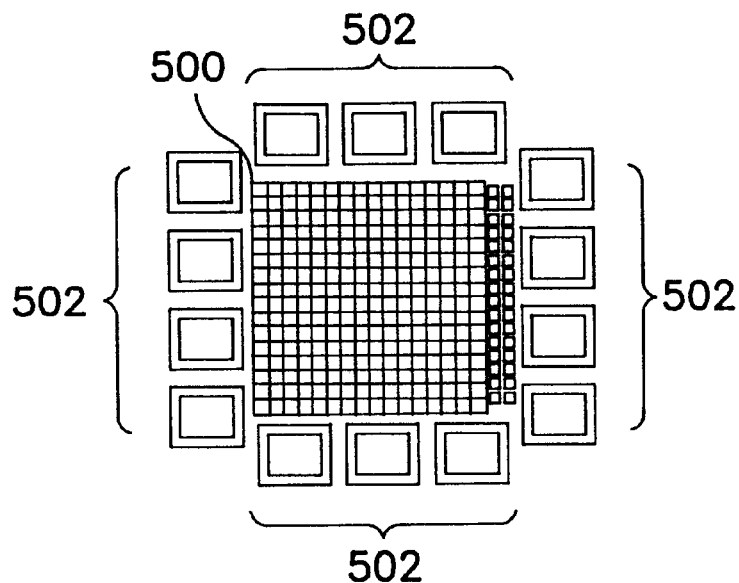
FIG. 5A depicts an exemplary configuration of a multiplexor test structure with proximate neighboring structures.
Figure 5B:
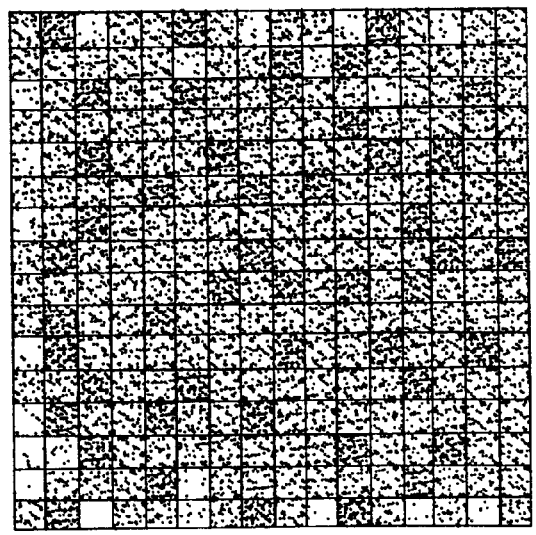
FIG. 5B is a graphic depiction of an exemplary yield pattern by bit cell for the multiplexor test structure depicted in FIG. 5A.
Figure 6A:
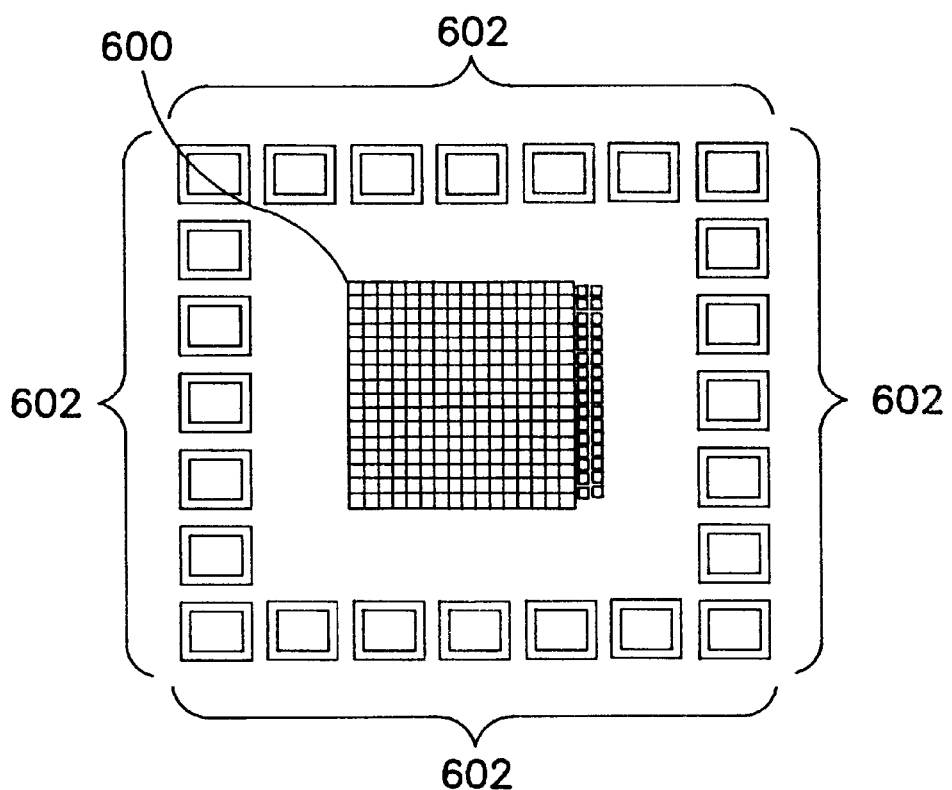
FIG. 6A depicts an exemplary configuration of a multiplexor test structure substantially isolated from neighboring structures.
Figure 6B:
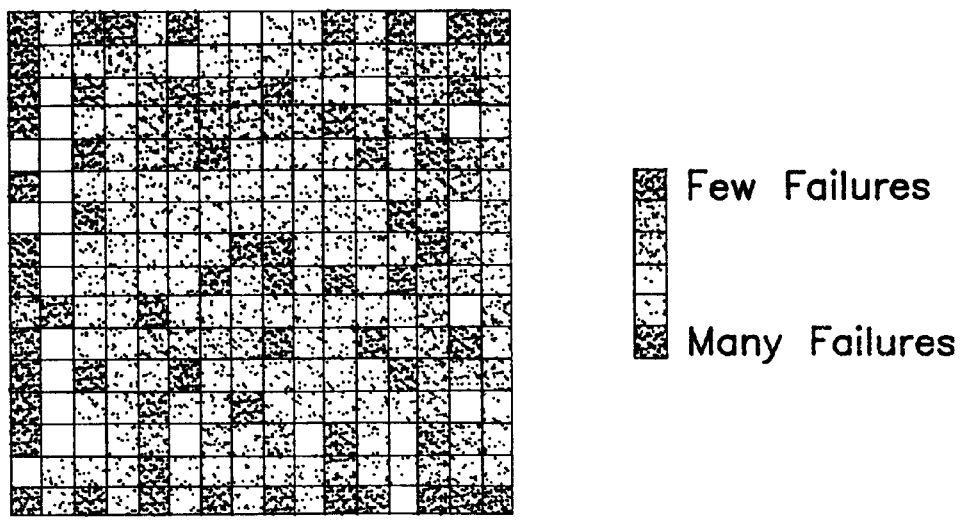
FIG. 6B is a graphic depiction of an exemplary yield pattern by bit cell for the multiplexor test structure depicted in FIG. 6A.

Finally, by looking at the yield of each bit in a multiplexor, spatial dependencies within a die can be observed and correlated to various process effects. For example, consider the two sample structures shown in FIG. 5. FIG. 5A shows a multiplexor 500 with neighboring structures 502 placed very close to the multiplexor 500 while FIG. 6A shows a multiplexor 600 which has been isolated from neighboring structures 602. The resulting example yield patterns by bit cell for FIGS. 5A and 6A are shown in FIGS. 5B and 6B respectively. Clearly, the number of failures around the edge of the multiplexor structure is significantly higher for FIG. 6B compared to FIG. 5B. Thus, one can conclude that there are systematic failure mechanisms owing to differences in density of neighboring structures or lack of proximity of neighboring metal/vias. This is because FIG. 5A has a uniform density around the edge of the multiplexor while FIG. 6A has a very different and much lower density around the edge of the multiplexor.

Figure 7:
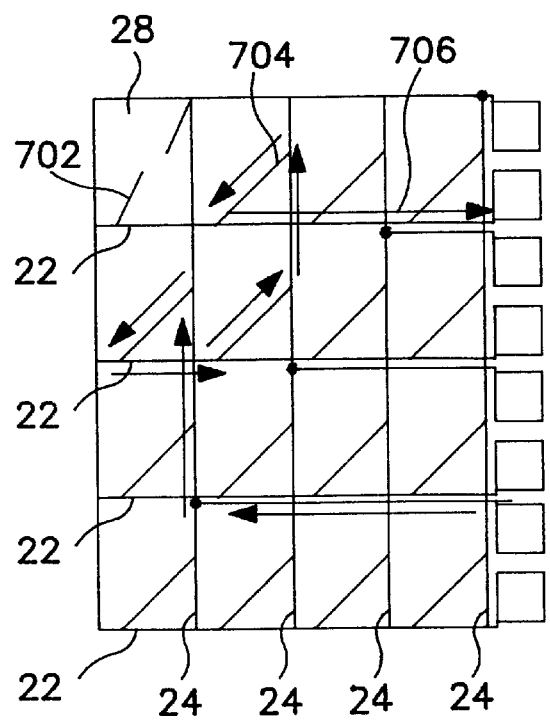
FIG. 7 is a schematic representation of a 4×4 multiplexor test structure in which an erroneous current reading is made.

Measuring the yield of each bit in the passive multiplexor test structure is not simply a matter of measuring the current flowing between the bit line and word line connected to each bit. This is because the passive multiplexor test structure is multiply connected. Even if the structure within a bit cell under test is in fact an open circuit, a current will still be measured because it will find a way to go from the word line to the bit line using any of the other surrounding bit or word lines. FIG. 7 depicts an example of how a current can still flow in the case where a bit cell 28 under test actually contains an open circuit as schematically represented by broken line 702. If the structure in the bit cell 28 in the upper left corner is open, and the structures in the remaining bit cells 28 are complete circuits (i.e. no shorts), a current can still snake across the word line 22 and bit lines 24 attached to the structure in this particular bit cell 28 as shown, for example, by the path depicted by the heavy solid lines 704 and arrows 706.

Figure 8:
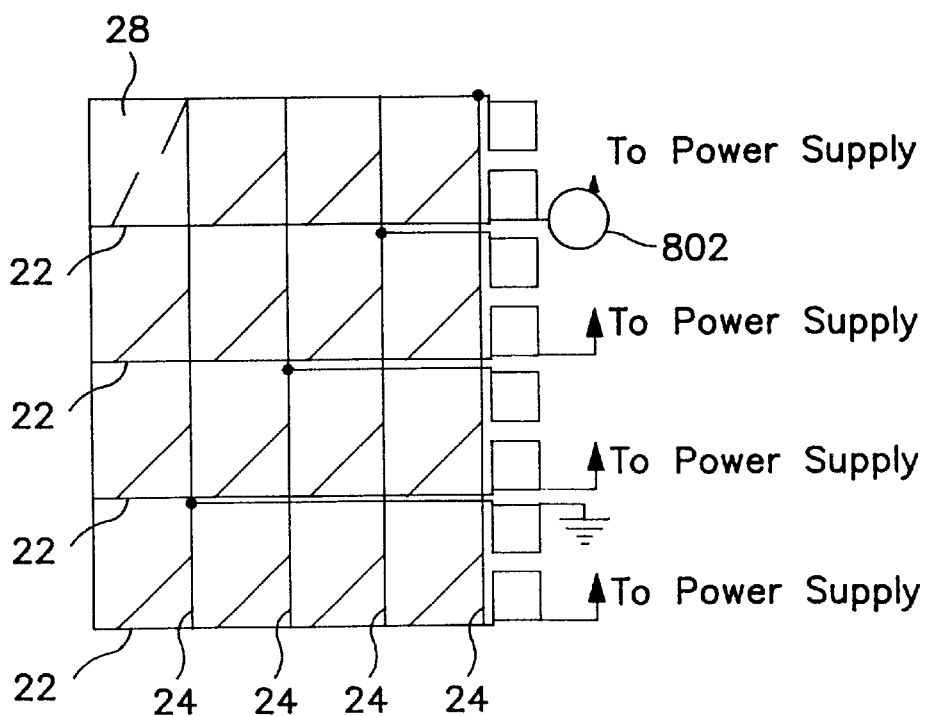
FIG. 8 is a schematic representation of a 4×4 multiplexor test structure in which the erroneous current reading in FIG. 7 is eliminated.
Figure 9B:
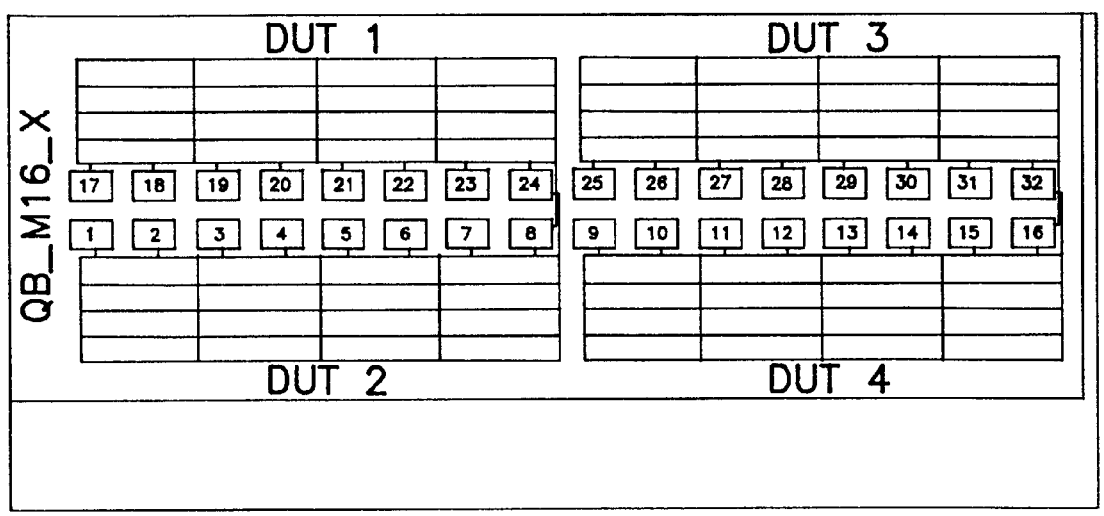
FIG. 9A contains a table listing measurement vectors for parametric testing on a 4×4 multiplexor of the type depicted schematically in FIG. 9B.

In order to test a particular bit, a different approach is utilized in the present invention. In one embodiment of this approach, as depicted in FIG. 8, all of the word lines 22 are be attached to the power supply and only the bit line. 24 connected to the structure in the bit cell 28 of interest is connected to ground. All of the other bit lines 24 are left unconnected. The current flowing from the word line 22 connected to the structure of the bit cell 28 of interest to the grounded bit line 24 is the measurement of concern. The preferred procedure for measuring the bit cell 28 in upper left of a 4×4 configuration is depicted in FIG. 8 with the current measured by measuring device 802. By measuring the current flowing through each word line 22 with a particular bit line 24 grounded and then rotating through all the bit lines 24, the current through each individual bit cell 28 can be measured. If the measured current is below some pre-defined threshold, the structure in the selected bit cell 28 is considered failed. For a 4×4 configuration exemplified in FIG. 9B, the complete set of 16 test vectors can be found in the table of FIG. 9A.

Since no diodes or other active devices are needed, the passive multiplexor test structure of the present invention can be run as a short-flow; i.e. only METAL1-VIA-METAL2 in the case of via or POLY-CONTACT-METAL1 or AA-CONTACT-METAL1 in the case of contacts need to be fabricated. Even though an entire passive multiplexor structure may contain 100,000 vias or contacts, a 16×16 configuration implies that each bit would have 100,000/256~400 vias. Thus, failures can be localized down to 400 vias, which is far easier to do failure analysis on, rather than 100,000 vias, for which failure analysis is practically impossible without prolonged use of special tools such as voltage contrast testers.

Figure 10A:
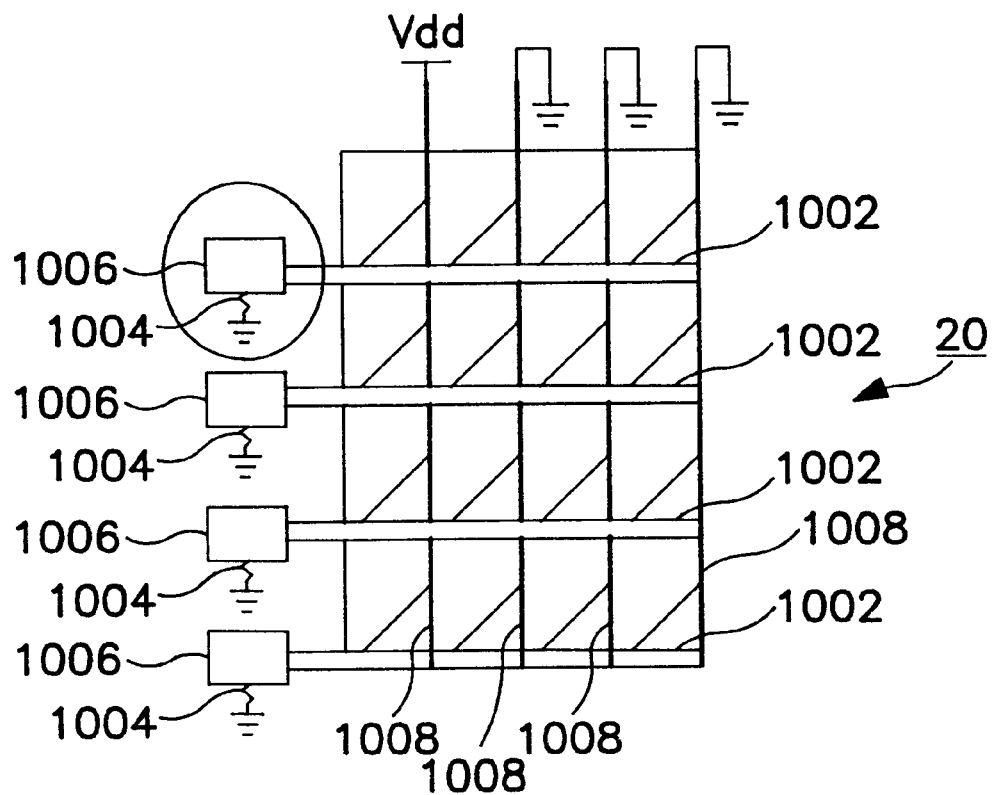
FIG. 10A is a schematic depiction of a measurement setup using a digital tester.
Figure 10B:
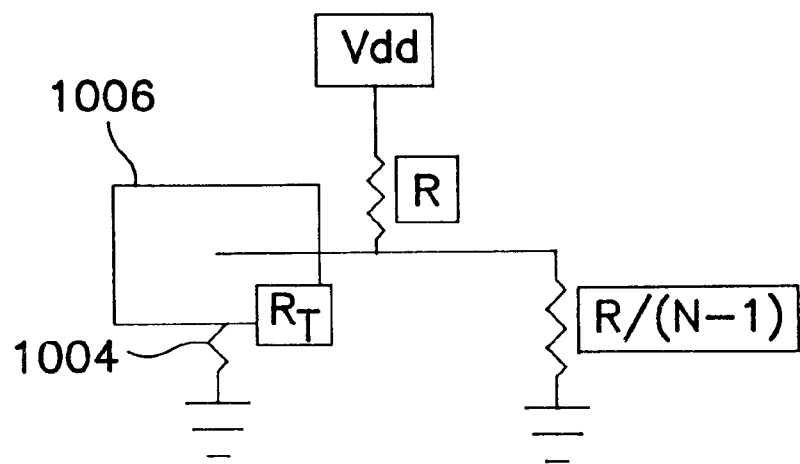
FIG. 10B depicts, in schematic form, that portion of the measurement test setup contained within the circled region of FIG. 10A.

For rapid measurement, a digital test approach is utilized. FIGS. 10A and 10B depict the setup for measurement using a digital tester for a 4×4 multiplexor test structure 20 in accordance with the present invention. In each case, a terminating resistor, having a value $R_T$, is attached to each row 1002 of the multiplexor 20. It is preferable, but not necessary, that $R_T >> R$, where R is the resistance of the test structure within an individual bit cell 28. The rows 1002 of the multiplexor 20 are attached to the measurement channels 1006 of the digital tester (not shown). Using a measurement channel 1006, the terminating resistor RT can be set to any reasonable value. A "1" or "Vdd" is attached to one of the N columns 1008 of the multiplexor 20 as shown in FIG. 10A and the remaining columns 1008 are attached to "0" or "Gnd". As far as the measurement channel 1006 is concerned, the multiplexor 20 looks like a voltage divider with one end connected to a resistor of value R through Vdd and the other end connected to ground through (N–1) resistors each valued at R connected in parallel to the terminating resistor (see FIG. 10B).

If it is assumed that $R_T >> R$, then the measurement channel sees a voltage of approximately (Vdd/N) if there are no opens in the structure or a voltage of nearly "0" if there is an open in the chain. In this way, if it is assumed that any voltage >0++is a pass and any voltage approximately equal to zero is a fail, the yield of each chain can be measured. It is preferable that the pass/fail criteria not be set to exactly zero since some noise is always present in the system. Also, since the digital tester has many measurement channels, the yield of each chain in the column can be measured simultaneously. The measurement method can then be repeated on the next column, and so on. Since a digital tester can make each measurement in microseconds, the entire passive multiplexor can be tested in less than 1 second. Although the description of the method recited above entails the use of digital testers, this method can be equally replicated using an analog or parametric measurement method and such is considered to be within the scope of the present invention.

Although serial via chains are often placed inside each bit as described above, any type of structure where measuring open yield is important can be used. For example, a large transistor or diffusion region can be used (although these applications would prevent the use of a short-flow) or a long snake of wire can be used instead.

We claim:

1. A method for analyzing failures due to fabrication induced defects in integrated circuits comprising the steps of:

a) providing a matrix of first lines and second lines, each first line having an associated first line probe pad electrically connected thereto, and each second line having an associated second line probe pad electrically connected thereto; and b) providing a plurality of passive test structures, each associated with a respective first line and a respective second line, each test structure electrically connected between a first line and a second line, and each test structure having at least one variable attribute which is used to detect defects and create yield models.

2. The method in accordance with claim 1 wherein at least one of the test structures comprises a serial via chain.

3. The method in accordance with claim 1 wherein at least one of the test structures comprises a serial contact chain.

4. The method in accordance with claim 1 wherein at least one of the test structures comprises a poly/contact/metal 1 structure.

5. The method in accordance with claim 1 wherein at least one of the test structures comprises a active/contact/mretal 1 structure.

6. The method in accordance with claim 1 wherein at least one of the test structures comprises a metal, poly, or active line for detecting metal, poly, or active opens.

7. The method in accordance with claim 1 wherein at least one of the test structures comprises a transistor for detecting transistor opens.

8. The method in accordance with claim 1 wherein step (b) includes varying attribute values, so that two or more of the plurality of test structures have respectively different attribute values for at least one of the following:

1) metal 1 border x and y directions;

2) spacing of metal 2 neighbor to via chain;

3) misalignment of via to metal 1, x and y directions;

4) misalignment of via to metal 2, x and y directions;

5) spacing of metal 1 neighbor to via chain;

6) spacing of via to nearest via;

7) metal 2 border x and y directions;

8) via hole size;

9) metal 2 runner length;

10) metal 1 neighbor line width perpendicular to via chain;

11) metal 2 neighbor line width parallel to via chain;

12) metal 2 neighbor line width perpendicular to via chain;

13) metal 2 runner length; and 14) metal 1 neighbor line width perpendicular to via chain.

9. A method for analyzing failures due to fabrication induced defects in integrated circuits comprising:
   a) providing a source of electrical current, said current source having a first electrical potential of a first magnitude and a second electrical potential of a second magnitude which differs from the first magnitude by a predetermined amount;
   b) providing a matrix of first lines and second lines, each first line having an associated first line probe pad electrically connected thereto, and each second line having an associated second line probe pad electrically connected thereto, all first line probe pads being electrically connected to the first potential of said current source and each second line probe pad being selectively, individually electrically connectable to the second potential of said current source;
   c) providing test structures associated with said first and second lines, each test structure electrically connected between a respective first line and a respective second line, and each test structure having at least one variable attribute which is used to detect defects and create yield models; and
   d) electrically connecting a current measuring device to each first line for measuring the current through the test structure associated with said first line.

10. The method in accordance with claim 9 wherein at least one of the test structures comprises a serial via chain.

11. The method in accordance with claim 9 wherein at least one of the test structures comprises a serial contact chain.

12. The method in accordance with claim 9 wherein at least one of the test structures comprises a poly/contact/metal 1 structure.

13. The method in accordance with claim 9 wherein at least one of the test structures comprises a active/contact/metal 1 structure.

14. The method in accordance with claim 9 wherein at least one of the test structures comprises a metal, poly, or active line for detecting metal, poly, or active opens.

15. The method in accordance with claim 9 wherein at least one of the test structures comprises a transistor for detecting transistor opens.

16. The method in accordance with claim 9 wherein step (c) includes varying attribute values so that two or more of the plurality of test structures have respectively different attribute values for at least one of the following:
   1) metal 1 border x and y directions;
   2) spacing of metal 2 neighbor to via chain;
   3) misalignment of via to metal 1, x and y directions;
   4) misalignment of via to metal 2, x and y directions;
   5) spacing of metal 1 neighbor to via chain;
   6) spacing of via to nearest via;
   7) metal 2 border x and y directions;
   8) via hole size;
   9) metal 2 runner length;
   10) metal 1 neighbor line width perpendicular to via chain;
   11) metal 2 neighbor line width parallel to via chain;
   12) metal 2 neighbor line width perpendicular to via chain;
   13) metal 2 runner length; and
   14) metal 1 neighbor line width perpendicular to via chain.

17. A method for analyzing failures due to fabrication induced defects in integrated circuits comprising the steps of:
   a) providing a matrix of first lines and second lines, each first line having an associated first line probe pad electrically connected thereto, and each second line having an associated second line probe pad electrically connected thereto; and
   b) providing a plurality of test structures, each associated with a respective first line and a respective second line, each test structure electrically connected between a first line and a second line, and each test structure having at least one variable attribute which is used to detect defects and create yield models, wherein two or more of the plurality of test structures have respectively different attribute values for the at least one variable attribute, wherein step (b) includes varying the value of at least one of the following:
   1) metal box 1 border x and y directions;
   2) spacing of metal 2 neighbor to via chain;
   3) misalignment of via to metal 1, x and y directions;
   4) misalignment of via to metal 2, x and y directions;
   5) spacing of metal 1 neighbor to via chain;
   6) spacing of via to nearest via;
   7) metal 2 border x and y directions;
   8) via hole size;
   9) metal 2 runner length;
   10) metal 1 neighbor line width perpendicular to via chain;
   11) metal 2 neighbor line width parallel to via chain;
   12) metal 2 neighbor line width perpendicular to via chain;
   13) metal 2 runner length; and
   14) metal 1 neighbor line width perpendicular to via chain.

18. The method of claim 17, wherein step (b) includes varying the attribute values of two or more attributes so that each varied attribute has two or more values, whereby the plurality of test structure include four or more different combinations of attribute values.

19. The method of claim 18, wherein step (b) includes varying the values of two or more of the following attributes:
   1) metal 1 border x and y directions;
   2) spacing of metal 2 neighbor to via chain;
   3) misalignment of via to metal 1, x and y directions;
   4) misalignment of via to metal 2, x and y directions;
   5) spacing of metal 1 neighbor to via chain;
   6) spacing of via to nearest via;
   7) metal 2 border x and y directions;
   8) via hole size;
   9) metal 2 runner length;
   10) metal 1 neighbor line width perpendicular to via chain;
   11) metal 2 neighbor line width parallel to via chain;
   12) metal 2 neighbor line width perpendicular to via chain;
   13) metal 2 runner length; and
   14) metal 1 neighbor line width perpendicular to via chain.

20. The method of claim 18, further comprising:

testing the plurality of test structures; and identifying the impact of each attribute on the yield, based on the testing.

21. The method of claim 1, wherein the first lines, second lines, first line probe pads, second line probe pads and plurality of test structures are formed in a short flow test vehicle.

22. The method of claim 9, wherein the first lines, second lines, first line probe pads, second line probe pads and plurality of test structures are formed in a short flow test vehicle.

23. The method of claim 17, wherein the first lines, second lines, first line probe pads, second line probe pads and plurality of test structures are formed in a short flow test vehicle.

\* \* \* \* \*